US012751236B2

(12) United States Patent
Mathew et al.

(10) Patent No.: US 12,751,236 B2
(45) Date of Patent: Sep. 29, 2026

(54) TEMPERATURE CONTROL SYSTEM WITH FLAMMABLE HEAT TRANSFER FLUID

(71) Applicant: Applied Materials, Inc., Santa Clara, CA (US)

(72) Inventors: Rony David Mathew, Bengaluru (IN); Varun Kumar Chenna, Bangalore (IN)

(73) Assignee: Applied Materials, Inc., Santa Clara, CA (US)

( * ) Notice: Subject to any disclaimer, the term of this patent is extended or adjusted under 35 U.S.C. 154(b) by 19 days.

(21) Appl. No.: 18/431,051

(22) Filed: Feb. 2, 2024

(65) Prior Publication Data

US 2025/0065462 A1 Feb. 27, 2025

(30) Foreign Application Priority Data

Aug. 21, 2023 (IN) ............................ 202341055820

(51) Int. Cl.
*H10P 72/00* (2026.01)

(52) U.S. Cl.
CPC ................................ *H10P 72/0434* (2026.01)

(58) Field of Classification Search
CPC . H01L 21/67109; H10P 72/0434; G01M 3/28
See application file for complete search history.

(56) References Cited

U.S. PATENT DOCUMENTS 3,664,357 A * 5/1972 Kreiss ....................... F17D 5/06 73/40.5 R
2009/0095451 A1 4/2009 Moroz
2010/0119420 A1 5/2010 Chandler et al.
2014/0262030 A1* 9/2014 Buchberger, Jr. ........................... H01J 37/32724 118/723 R
2019/0063689 A1* 2/2019 Liu ..................... G01M 3/2815

FOREIGN PATENT DOCUMENTS

| | | | | | |
|---|---|---|---|---|---|
| CN | 116453971 | A | * | 7/2023 | ............. G01M 3/26 |
| KR | 19980079277 | A | | 11/1998 | |
| KR | 19980083309 | A | | 12/1998 | |
| KR | 20060083571 | A | * | 7/2006 | ....... H01L 21/67248 |
| KR | 20220088551 | A | | 6/2022 | |
| KR | 20230111143 | A | | 7/2023 | |

OTHER PUBLICATIONS

International Search Report and Written Opinion for International Application No. PCT/US2024/043100, mailed Dec. 4, 2024, 9 Pages.

* cited by examiner

*Primary Examiner* — Eric S Ruppert
(74) *Attorney, Agent, or Firm* — Lowenstein Sandler LLP

(57) ABSTRACT

A system includes a closed loop configured to flow a heat transfer fluid to regulate temperature of a process tool. The heat transfer fluid includes a flammable or combustible fluid. The system further includes a temperature control unit configured to receive the heat transfer fluid and regulate temperature of the heat transfer fluid. The system further includes a plurality of sensor configured to measure one or more properties of the heat transfer fluid. The system further includes a controller configured to determine a fault in the closed loop based on sensor data received from the plurality of sensors and to further cause a corrective action responsive to determining the fault.

20 Claims, 5 Drawing Sheets

TEMPERATURE CONTROL SYSTEM WITH FLAMMABLE HEAT TRANSFER FLUID

RELATED APPLICATIONS

This application claims the benefit under 35 U.S.C. § 119(a) of Indian Provisional Application No. 202341055820, filed Aug. 21, 2023, the content of which is hereby incorporated by reference in its entirety.

TECHNICAL FIELD

The instant specification generally relates to temperature control systems with flammable heat transfer fluid for the regulation of process tool temperature. More specifically, the instant specification relates to closed loop systems for flowing flammable heat transfer fluid and sensors and methods for detecting leaks in the closed loop.

BACKGROUND

Substrate processing can utilize operations that are optimally performed at target temperatures. The processing chambers include fluid loops for heat transfer fluid flow to remove and/or add heat to the processing chambers. By removing heat from and/or adding heat to the processing chambers by regulating the temperature of the heat transfer fluid, substrate processing can be optimized.

SUMMARY

The following is a simplified summary of the disclosure in order to provide a basic understanding of some aspects of the disclosure. This summary is not an extensive overview of the disclosure. It is not intended to delineate any scope of the particular implementations of the disclosure or any scope of the claims. Its sole purpose is to present some concepts of the disclosure in a simplified form as a prelude to the more detailed description that is presented later.

In some embodiments, a system includes a closed loop configured to flow a heat transfer fluid to regulate temperature of a process tool. The heat transfer fluid includes a flammable or combustible fluid. The system further includes a temperature control unit configured to receive the heat transfer fluid and regulate temperature of the heat transfer fluid. The system further includes a plurality of sensor configured to measure one or more properties of the heat transfer fluid. The system further includes a controller configured to determine a fault in the closed loop based on sensor data received from the plurality of sensors and to further cause a corrective action responsive to determining the fault.

In some embodiments, a method includes causing regulation of temperature of a process tool by a flow of heat transfer fluid to the process tool along a closed loop. The heat transfer fluid comprises a flammable or combustible fluid. The method further includes causing regulation of temperature of the heat transfer fluid in a temperature control unit configured to receive the heat transfer fluid from the process tool. The method further includes receiving sensor data indicative of one or more measured properties of the heat transfer fluid. The method further includes determining a fault in the closed loop based on the sensor data. The method further includes causing a corrective action responsive to determining the fault.

In some embodiments, a system includes a temperature control unit, a process tool, and a closed loop to flow a heat transfer fluid between the temperature control unit and the process tool. The heat transfer fluid includes a flammable or combustible fluid. The system further includes a plurality of sensors configured to measure one or more properties of the heat transfer fluid. The system further includes a controller. The controller is configured to cause the heat transfer fluid to flow along the closed loop to regulate temperature of the process tool. The controller is further configured to cause the temperature control unit to regulate temperature of the heat transfer fluid. The controller is further configured to receive sensor data from the plurality of sensors indicative of the one or more properties of the heat transfer fluid. The controller is further configured to determine a fault in the closed loop based on the sensor data. The controller is further configured to cause a corrective action responsive to determining the fault.

BRIEF DESCRIPTION OF THE DRAWINGS

Aspects and implementations of the present disclosure will be understood more fully from the detailed description given below and from the accompanying drawings, which are intended to illustrate aspects and implementations by way of example and not limitation.

DETAILED DESCRIPTION

Figure 1:
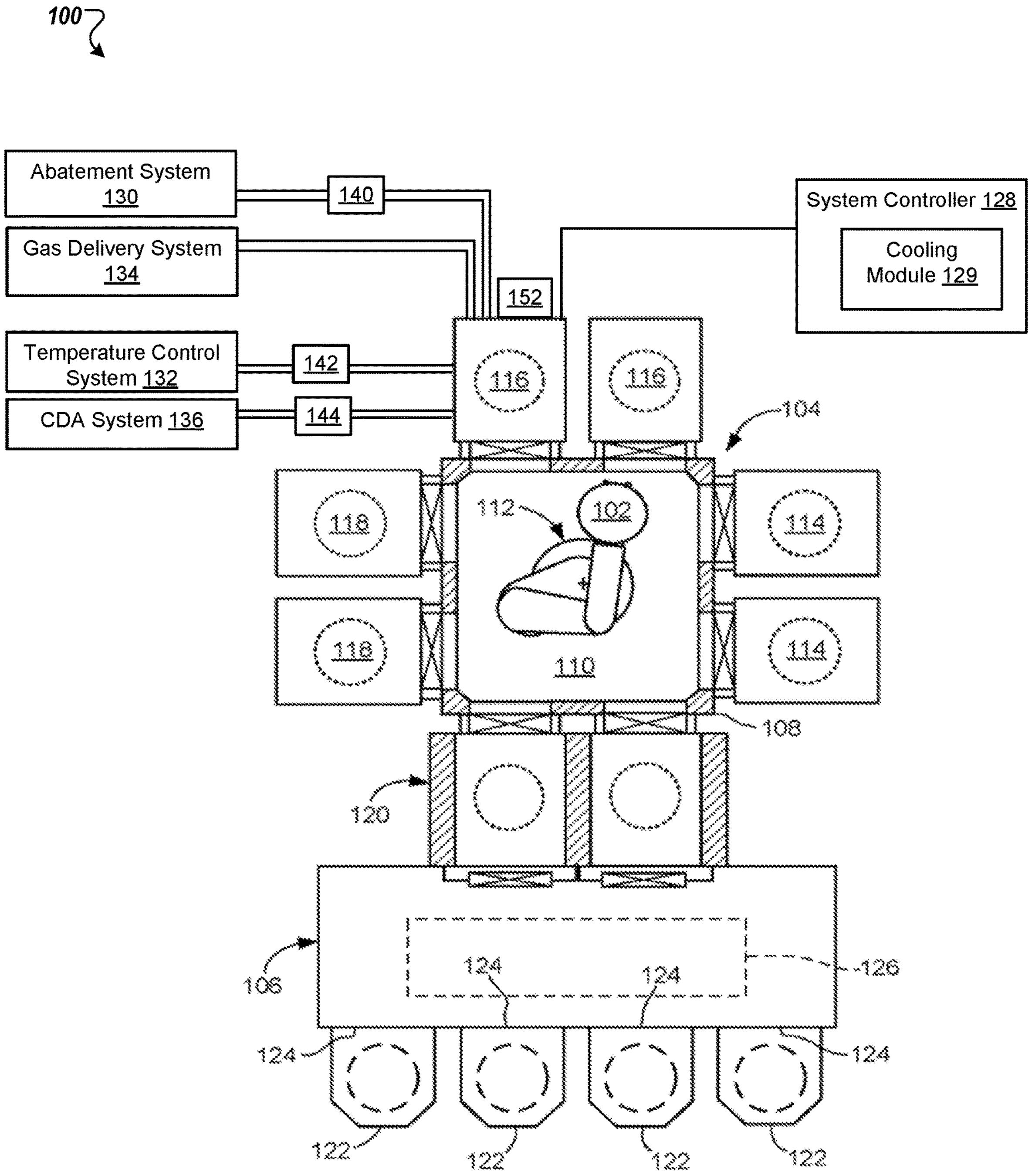
FIG. 1 is a top schematic view of an example manufacturing system, according to aspects of the present disclosure.

Embodiments of the present disclosure are directed to temperature control systems for flammable or combustible heat transfer fluids. Substrate processing operations are often performed at target temperatures to optimize operation performance. In some embodiments, component parts in a processing chamber are to be heated and/or cooled to the target temperature by a loop flowing a heat transfer fluid.

Conventional substrate processing systems use polyfluoroalkyl substances (PFAS), deionized water, or a mixture of ethylene glycol and water as a heat transfer fluid (HTF) to heat and/or cool a process tool such as a processing chamber. These fluids have been conventionally used because of their dielectric properties. In some process tools such as plasma process chambers, high voltage used to generate the plasma can arc through the HTF. Using a dielectric HTF that does not conduct electricity such as conventional PFAS fluids avoids these arcing problems. PFAS fluids that are conventionally used have desirable dielectric properties for use as HTF in plasma chambers. However, PFAS fluids are now known to be harmful to the environment and toxic to humans and other mammalian life. Additionally, PFASs are commonly described as persistent organic pollutants, or "forever chemicals," because they remain in the environment for long periods of time. Thus, concern about health and environmental regarding PFASs is well founded.

Aspects and implementations of the instant disclosure address the above-described and other shortcomings of conventional systems by using a non-PFAS HTF. In some embodiments, using non-PFAS HTF avoids the negative environmental and health impacts mentioned above. In some embodiments, a non-PFAS flammable and/or combustible liquid is used as an HTF to transfer heat to and/or from a process tool. In some embodiments, a flammable and/or combustible liquid includes substances such as mineral oils and/or synthetic oils that exhibit dielectric (e.g., non-electrically conductive) properties. Thus, the flammable and/or combustible fluids can be used in plasma process chambers without high voltage arcing through the HTF.

Throughout this disclosure, reference will be made to flammable fluid and/or flammable HTF. However, as used herein, the term “flammable” is to mean “flammable and/or combustible” to describe the characteristics of HTF as disclosed herein.

In some embodiments, the use of flammable HTF poses a risk of fire when exposed to oxygen (e.g., in the atmospheric air), especially at high temperature. In some embodiments, flammable HTF is flowed in a closed loop between a temperature control unit and a process tool so that the flammable HTF is not exposed to air and is thus not exposed to oxygen. Conventional systems using non-flammable HTF do not use a closed loop system, and instead expose the HTF to air. Conventionally, exposing HTF to air is not particularly dangerous. However, in embodiments where flammable HTF is used, exposure of the flammable HTF to air can pose a risk of fire (e.g., based on ambient conditions). Thus, in some embodiments, flammable HTF is flowed in a closed loop using substantially leak-proof fittings, welded connections, fluid-tight tanks, etc. In some embodiments, the closed loop flows flammable HTF to a process tool to regulate temperature of the process tool. A temperature control unit (TCU) receives the HTF from the process tool and regulates temperature of the HTF through one or more heating units and/or one or more cooling units. In some embodiments, the TCU includes a reservoir to collect HTF. The reservoir may contain the one or more heaters and/or one or more coolers. In some embodiments, the TCU includes a heat exchanger and/or an active cooler such as a vapor compression refrigerator, a thermoelectric refrigerator, or a suitable alternative.

In some embodiments, leakage of flammable HTF can pose a fire risk. In some embodiments, a system described herein includes sensors that are to measure properties of the HTF. In some embodiments, the sensors include temperature sensor(s), flow sensor(s), pressure sensor(s), and/or a tank level sensor (e.g., in a reservoir of the TCU). In some embodiments, the sensors provide sensor data to a controller that is configured to determine a fault in the closed loop based on the sensor data. In some embodiments, the controller determines that a leak exists in the closed loop and/or that the HTF has overheated. In some embodiments, the controller causes a corrective action responsive to determining the fault.

In some embodiments, the controller determines the fault based on a comparison of sensor data. For example, the controller can compare temperature data from a first temperature sensor with temperature data from a second temperature sensor. The difference in temperature reflected by the data may indicate an overheating condition of the HTF. In some embodiments, the controller can use sensor data from one temperature sensor to determine that the temperature of the HTF has exceeded a threshold temperature value. In some embodiments, the controller can determine that the closed loop has a leak by comparing flow data from two or more flow sensors. For example, the controller can compare flowrate data from a flow sensor measuring the flow of HTF to a process tool with flowrate data from a flow sensor measuring the flow of HTF from the process tool. When the two flowrates do not match (e.g., a mismatch), the controller may determine that the closed loop is leaking HTF. In some embodiments, the controller monitors data from a tank level sensor in a reservoir (e.g., in a TCU) that collects the HTF. When the level in the reservoir falls below a threshold level, as indicated by the tank level sensor data, the controller may determine that there is a leak either in the tank or in the closed loop, or both. In some embodiments, one or more pressure sensors provide pressure data to the controller. Fluctuations in pressure and/or sudden drops in pressure may indicate a leak.

In some embodiments, when the controller determines a fault (e.g., a leak and/or an overheating condition), the controller triggers an interlock to stop operation of the system. In some embodiments, the interlock shuts off power to a pump to stop the pumping of HTF between the TCU and the process tool so that a leak can be mitigated. In some embodiments, the interlock stops the processing in the process tool so that the HTF does not continue to overheat. In some embodiments, the interlock shuts off power to a heater to stop the heating of the HTF in the TCU.

Embodiments of the present disclosure provide advantages over conventional systems described above. Particularly, some embodiments described herein use a non-PFAS HTF that is not environmentally harmful and/or toxic. In some embodiments, the non-PFAS HTF used by systems described herein has zero global warming potential, zero ozone depletion potential, and/or is biodegradable. In some embodiments, flammable HTF is used meeting non-PFAS specifications. In some embodiments, flammable HTF has the same dielectric properties of conventionally used PFAS HTF but without harmful environmental impact. Thus, the systems described herein are more environmentally friendly than conventional systems and include features to reduce risks associated with flammable HTF (e.g., flammability risks, etc.). Additionally, because the flammable HTF is flowed in a closed loop, flow frictional losses are minimized when compared to conventional systems that use an open loop. Therefore, power consumption of the systems disclosed herein is reduced compared to the conventional systems.

FIG. 1 is a top schematic view of an example processing system 100 (also referred to herein as a manufacturing system), according to aspects of the present disclosure. In some embodiments, processing system 100 may be an electronics processing system configured to perform one or more processes on a substrate 102. In some embodiments, processing system 100 may be an electronics device manufacturing system. Substrate 102 can be any suitably rigid, fixed-dimension, planar article, such as, e.g., a silicon-containing disc or wafer, a patterned wafer, a glass plate, or the like, suitable for fabricating electronic devices or circuit components thereon. In some embodiments, processing system 100 is a semiconductor processing system. Alternatively, processing system 100 may be configured to process other types of devices, such as display devices.

Processing system 100 includes a process tool 104 (e.g., a mainframe) and a factory interface 106 coupled to process tool 104. Process tool 104 includes a housing 108 having a transfer chamber 110 therein. Transfer chamber 110 includes one or more processing chambers (also referred to as processing chambers) 114, 116, 118 disposed therearound and coupled thereto. Processing chambers 114, 116, 118 can be coupled to transfer chamber 110 through respective ports, such as slit valves or the like.

Processing chambers 114, 116, 118 can be adapted to carry out any number of processes on substrates 102. A same or different substrate process can take place in each processing chamber 114, 116, 118. Examples of substrate processes include atomic layer deposition (ALD), physical vapor deposition (PVD), chemical vapor deposition (CVD), etching, annealing, curing, pre-cleaning, metal or metal oxide removal, or the like. In one example, a PVD process is performed in one or both of processing chambers 114, an etching process is performed in one or both of processing chambers 116, and an annealing process is performed in one or both of processing chambers 118. Other processes can be carried out on substrates therein. Processing chambers 114, 116, 118 can each include a substrate support assembly. The substrate support assembly can be configured to hold a substrate in place while a substrate process is performed. Processing chamber 114, 116, 118 can each include one or more cooling loops through which coolant (e.g., water, flammable heat transfer fluid, etc.) may flow to cool the processing chamber.

Transfer chamber 110 also includes a transfer chamber robot 112. Transfer chamber robot 112 can include one or multiple arms, where each arm includes one or more end effectors at the end of the arm. The end effector can be configured to handle particular objects, such as wafers. In some embodiments, transfer chamber robot 112 is a selective compliance assembly robot arm (SCARA) robot, such as a 2 link SCARA robot, a 3 link SCARA robot, a 4 link SCARA robot, and so on.

A load lock 120 can also be coupled to housing 108 and transfer chamber 110. Load lock 120 can be configured to interface with, and be coupled to, transfer chamber 110 on one side and factory interface 106 on another side. Load lock 120 can have an environmentally-controlled atmosphere that is changed from a vacuum environment (where substrates are transferred to and from transfer chamber 110) to at or near an atmospheric-pressure inert-gas environment (where substrates are transferred to and from factory interface 106) in some embodiments. In some embodiments, load lock 120 is a stacked load lock having a pair of upper interior chambers and a pair of lower interior chambers that are located at different vertical levels (e.g., one above another). In some embodiments, the pair of upper interior chambers are configured to receive processed substrates from transfer chamber 110 for removal from process tool 104, while the pair of lower interior chambers are configured to receive substrates from factory interface 106 for processing in process tool 104. In some embodiments, load lock 120 is configured to perform a substrate process (e.g., an etch or a pre-clean) on one or more substrates 102 received therein.

Factory interface 106 can be any suitable enclosure, such as, e.g., an Equipment Front End Module (EFEM). Factory interface 106 can be configured to receive substrates 102 from substrate carriers 122 (e.g., Front Opening Unified Pods (FOUPs)) docked at various load ports 124 of factory interface 106. A factory interface robot 126 (shown dotted) can be configured to transfer substrates 102 between substrate carriers 122 (also referred to as containers) and load lock 120. In other and/or similar embodiments, factory interface 106 is configured to receive replacement parts from replacement parts storage containers 123. Factory interface robot 126 can include one or more robot arms and can be or include a SCARA robot. In some embodiments, factory interface robot 126 has more links and/or more degrees of freedom than transfer chamber robot 112. Factory interface robot 126 can include an end effector on an end of each robot arm. The end effector can be configured to pick up and handle specific objects, such as wafers. Alternatively, or additionally, the end effector can be configured to handle objects such as process kit rings.

Any conventional robot type can be used for factory interface robot 126. Transfers can be carried out in any order or direction. Factory interface 106 can be maintained in, e.g., a slightly positive-pressure non-reactive gas environment (using, e.g., nitrogen as the non-reactive gas) in some embodiments.

Processing system 100 can also include a system controller 128. System controller 128 can be and/or include a computing device such as a personal computer, a server computer, a programmable logic controller (PLC), a microcontroller, and so on. System controller 128 can include one or more processing devices, which can be general-purpose processing devices such as a microprocessor, central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device can also be one or more special-purpose processing devices such as an application specific integrated circuit (ASIC), a field programmable gate array (FPGA), a digital signal processor (DSP), network processor, or the like. System controller 128 can include a data storage device (e.g., one or more disk drives and/or solid state drives), a main memory, a static memory, a network interface, and/or other components. System controller 128 can execute instructions to perform any one or more of the methodologies and/or embodiments described herein. The instructions can be stored on a computer readable storage medium, which can include the main memory, static memory, secondary storage and/or processing device (during execution of the instructions). In embodiments, execution of the instructions by system controller 128 causes system controller to perform the method of FIG. 4. System controller 128 can also be configured to permit entry and display of data, operating commands, and the like by a human operator.

In some embodiments, system controller 128 controls a cooling module 129, which may be a local server (e.g., hosted on a local server) that executes on the system controller 128 of the processing system 100. The cooling module 129 may be responsible for processing first sensor data generated by sensors of one or more processing chambers 114, 116, 118 as well as second sensor data from additional sensors 140, 142, 144 that are external to the processing chamber 114, 116, 118. The first sensor data may be generated by sensors that are integral to the processing chamber 114, 116, 118. Such sensors may include, for example, temperature sensors, power sensors, current sensors, pressure sensors, concentration sensors, and so on. The first sensor data output by the integral sensors of the processing chambers 114, 116, 118 may include measurements of current, voltage, power, flow (e.g., of one or more gases, CDA, water, etc.), pressure, concentration (e.g., of one or more gases), speed (e.g., of one or more moving parts, of gases, etc.), acceleration (e.g., of one or more moving parts, of gases, etc.), or temperature (e.g., of a substrate under process, of different locations in a processing chamber, and so on). In one embodiment, each chamber includes between about 20 to about 100 sensors. Although the cooling module 129 is described herein in association with processing system 100, in some embodiments, cooling module 129 is associated with multiple processing systems (e.g., one or more processing systems in a substrate processing facility).

In order to capture additional data not generally accessible by the integral sensors of the processing chambers 114, 116, 118, one or more external sensors 140, 142, 144, 152 may be attached to the processing chambers 114, 116, 118 and/or to feeds into and/or out of the processing chambers 114, 116, 118 and/or to sub-components that operate for the benefit of the processing chambers 114, 116, 118 (e.g., such as pumps and/or abatement systems). In one embodiment, each processing chamber includes about 3-6 external sensors attached to the processing chamber, sub-systems associated with the processing chamber, and/or inputs/outputs to and from the processing chamber. The second sensor data output by the external sensors 140, 142, 144, 152 may include, for example, current, flow, temperature, eddy current, concentration, vibration, voltage, or power factor. Examples of external sensors 140, 142, 144, 152 that may be used include clamp sensors that measure AC current or DC current (also referred to as a current clamp), clamp sensors that measure voltage, and clamp sensors that measure leakage current. Other examples of external sensors are vibration sensors, temperature sensors, ultrasonic sensors (e.g., ultrasonic flow sensors), accelerometers (i.e., acceleration sensors), etc.

In the example shown, an abatement system 130, a gas delivery system 134, a temperature control system 132 and/or a CDA system 136 may provide environmental resources to the processing chambers 114, 116, 118 and/or to other components of the processing system 100 (e.g., to the transfer chamber, factory interface, load locks, etc.). In some embodiments, the abatement system 130 performs abatement for residual gases, reactants and/or outputs associated with a process executed on a processing chamber 114, 116, 118. The abatement system 130 may burn residual gases and/or reactants, for example, to ensure that they do not pose an environmental risk. Additionally, in some embodiments, one or more pumps may be attached to and/or operate on behalf of one or more of the processing chambers 114, 116, 118.

In some embodiments, temperature control system 132 flows a heat transfer fluid to a processing chamber such as one or more of the processing chambers 114, 116, 118. In some embodiments, temperature control system 132 includes a closed loop that flows a flammable heat transfer fluid. In some embodiments, temperature control system 132 includes a temperature control unit to regulate temperature of the heat transfer fluid. The temperature control unit may include a reservoir to collect the heat transfer fluid and one or more heaters or coolers inside the reservoir. Regulating the temperature of the heat transfer fluid to a target temperature helps to regulate temperature of the associated processing chamber. One or more sensors measure properties of the heat transfer fluid. Such sensors may include one or more temperature sensors, one or more flow sensors, one or more pressure sensors, one or more gas detection sensors, and/or a tank level sensor in the reservoir. In some embodiments, a controller (e.g., such as cooling module 129) can use sensor data to determine whether there is a leak in the closed loop. If the sensor data indicates that a leak exists and/or that an overheating condition exists, the controller may trigger an interlock to stop operation of the temperature control system 132 until the leak is addressed.

External sensors 140, 142, 144, 152 are shown with relation to a single processing chamber 116 as a simplification for the sake of clarity. However, it should be understood that similar external sensors may be attached on additional processing chambers and/or on lines to and/or from such additional processing chambers and/or to sub-systems associated with such additional processing chambers.

Figure 2:
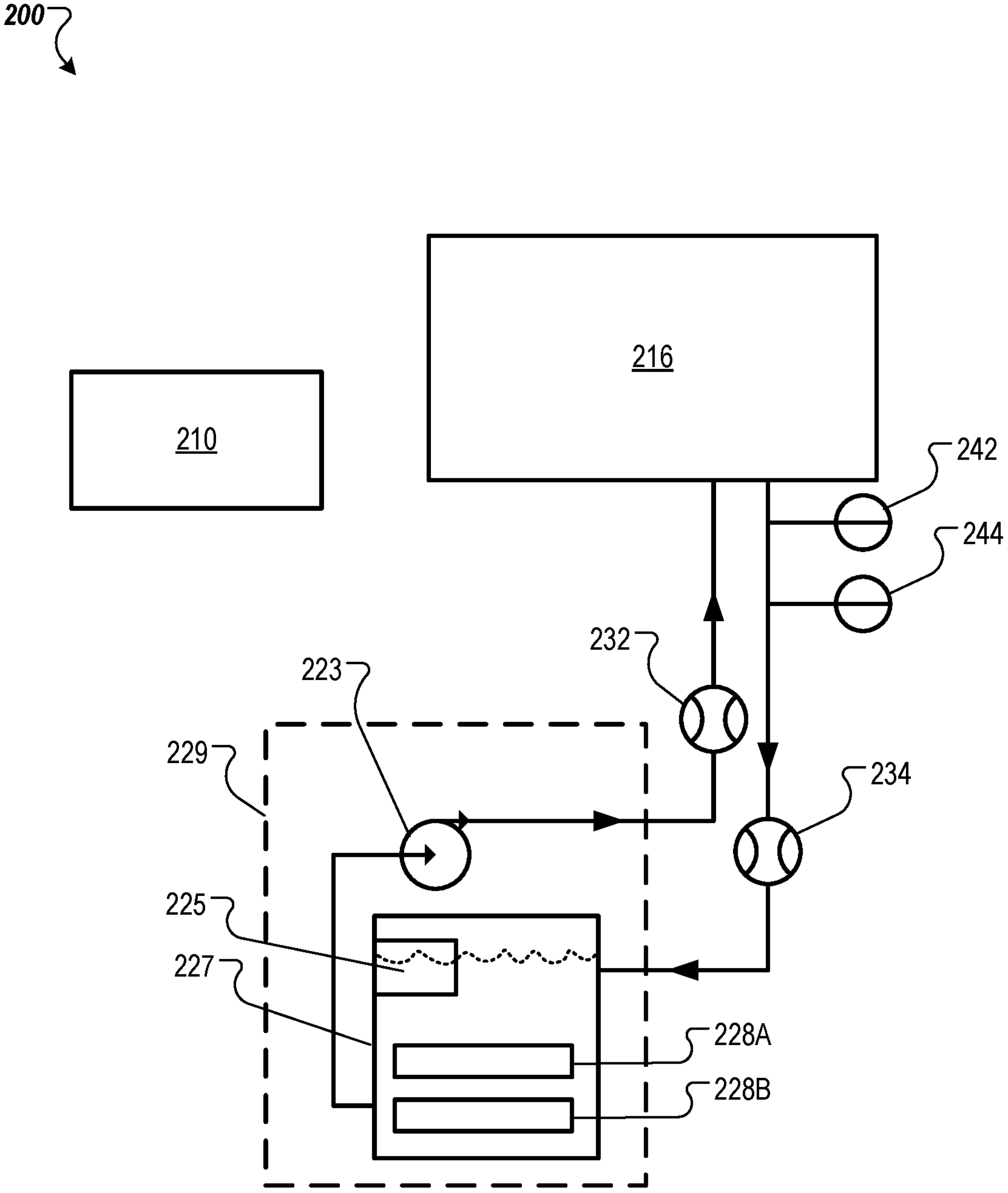
FIG. 2 is a schematic view of an example heat transfer system, according to aspects of the present disclosure.

FIG. 2 is a schematic view of an example heat transfer system 200, according to aspects of the present disclosure. In some embodiments, heat transfer system 200 includes a process tool 216 and a temperature control unit (TCU) 229. In some embodiments, heat transfer system 200 uses a flammable HTF to regulate temperature of the process tool 216. In some embodiments, process tool 216 is a substrate processing chamber such as an etch chamber, a plasma chamber, a deposition chamber, etc. In some embodiments, temperature control unit 229 is to regulate temperature of HTF flowing between TCU 229 and process tool 216. In some embodiments, providing HTF with a regulated temperature to process tool 216 regulates temperature of process tool 216. In some embodiments, process tool 216 is a substrate processing chamber, such as a plasma chamber, an etch chamber, a deposition chamber, etc. In some embodiments, HTF is flowed along a closed loop between TCU 229 and process tool 216. By flowing HTF along the closed loop, HTF is not exposed to atmospheric air. Therefore, flammable HTF can be used without risk of fire. In some embodiments, HTF is flowed through a flow line (e.g., a hard line, a hose, etc.) that is electrically isolated to avoid accidental arcing. In some embodiments, the flow line is constructed with materials which provide static (e.g., static electricity) dissipation. Such materials may include nylon, PTFE, and/or PFA. The flow line may include a material infused with carbon and/or another material to facilitate the dissipation of static. Without carbon (e.g., and/or another material to facilitate the dissipation of static) infused in the flow line material, it is possible for a static charge to build up in the flow line which can arc, causing a fire hazard. In some embodiments, the flow line is constructed with a non-metallic core that is non-conductive.

In some embodiments, TCU 229 includes a reservoir 227 to receive HTF. In some embodiments, reservoir 227 is a sealed tank. Reservoir 227 may not be open to atmosphere (e.g., reservoir 227 may be closed to atmosphere). In some embodiments, reservoir 227 is a sealed reservoir such that HTF is not exposed to atmospheric air. In some embodiments, the reservoir 227 is along a flow path of the closed loop. In some embodiments, reservoir 227 receives HTF flowing from process tool 216.

In some embodiments, a cooling unit 228A and/or a heating unit 228B are disposed inside reservoir 227 to heat and/or cool the HTF. In some embodiments, cooling unit 228A includes a heat exchanger that is configured to exchange heat between the HTF and a cooling medium such as a coolant or cooling fluid. Cooling unit 228A may cool HTF within reservoir 227 for cooling the process tool 216. In some embodiments, heating unit 228B includes a heating element, such as a resistive heating element, configured to heat HTF within reservoir 227. In some embodiments, the resistive heating element is configured to output greater than a threshold amount of heat but at less than a threshold temperature so as not to overheat the HTF at the surface of the resistive heating element. In designing the resistive heating element, the surface area may be increased so that the threshold amount of heat can be output without exceeding the threshold temperature. In some embodiments, cooling unit 228A and/or heating unit 228B are activated to regulate temperature of the HTF to a target temperature. In some embodiments, cooling unit 228A and heating unit 228B are not activated at the same time. In some embodiments, cooling unit 228A and/or heating unit 228B are controlled by a controller 210. For example, controller 210 may activate cooling unit 228A to cool the HTF and may activate heating unit 228B to heat the HTF. In some embodiments, controller 210 includes a processing device and/or processing logic to control system 200.

In some embodiments, a tank level sensor 225 is disposed within reservoir 227. Tank level sensor 225 may sense the level of HTF within reservoir 227. In some embodiments, controller 210 receives sensor data from tank level sensor 225 indicative of the level of HTF in the reservoir 227. In some embodiments, the controller 210 can determine whether the reservoir 227 and/or the closed loop is leaking HTF based on the tank level sensor data. For example, upon receiving sensor data indicating that the level of HTF in the reservoir has fallen below a threshold level, the controller 210 determines that a leak exists. Because the reservoir 227 is sealed and the closed loop is closed (e.g., not open to atmosphere) leaving no possibility for evaporation, a reduction of the level of HTF in the reservoir may be caused by a leak somewhere in the system. In some embodiments, tank level sensor 225 is a float sensor (e.g., a float switch). In some embodiments, one or more gas detection sensors are disposed within reservoir 227. The gas detection sensors may detect vaporized HTF within the reservoir 227. In some embodiments, the controller 210 can determine whether there is a leak and/or whether an overheating condition exists based on gas detection sensor data. For example, upon receiving sensor data indicating that more than a threshold amount of vaporized HTF is inside the reservoir 227, the controller 210 can determine that the HTF is overheated, causing the formation of vaporized HTF. The controller 210 may cause the performance of a corrective action based on the gas detection sensor data.

In some embodiments, TCU 229 includes a pump 223 configured to pump HTF from reservoir 227 to process tool 216 along a flow path of the closed loop. Pump 223 may be controlled by controller 210. In some examples, controller 210 can cause pump 223 to output more HTF to transfer more heat to or from process tool 216. In some embodiments, pump 223 is a centrifugal pump or a positive displacement pump. In some embodiments, HTF is pumped along a closed loop from TCU 229 to process tool 216 and back to TCU 229. In some embodiments, the HTF is circulated along the flow path of the closed loop. The closed loop may be sealed so that HTF is not exposed to oxygen in the surrounding air.

In some embodiments, pumped HTF flows through a first flow sensor 232. In some embodiments, flow sensor 232 measures one or more characteristics of the flow of HTF from the TCU 229 to the process tool 216. In some embodiments, flow sensor 232 measures flowrate of HTF. In some embodiments, HTF flowing from the process tool 216 to TCU 229 flows through a second flow sensor 234. In some embodiments, flow sensor 234 measures one or more characteristics of the flow of HTF from the process tool 216 to the TCU 229. In some embodiments, flow sensor 234 measures flowrate of HTF. In some embodiments, controller 210 receives flow data from flow sensor 232 and/or flow sensor 234. In some embodiments, controller 210 compares the flow data to determine whether there is a leak in the closed loop. For example, controller 210 may compare first flowrate data indicated by the flow sensor data from flow sensor 232 with second flowrate data indicated by the flow sensor data from flow sensor 234. A mismatch in first flowrate data and second flowrate data may indicate that HTF is leaking from the closed loop. In some embodiments, where the flowrate data from flow sensor 234 indicates a lesser flowrate than the flowrate data from flow sensor 232, the controller 210 may determine that the closed loop has a leak that is to be addressed.

In some embodiments, a temperature sensor 242 measures the temperature of the HTF. In some embodiments, temperature sensor 242 measures the temperature of HTF flowing from the process tool 216. In some embodiments, a temperature sensor measures the temperature of HTF flowing into the process tool 216. The controller 210 may activate the cooling unit 228A and/or the heating unit 228B based on temperature sensor data from temperature sensor 242. In some embodiments, the controller 210 may control the pump 223 based on the temperature sensor data. For example, controller 210 may cause the pump 223 to pump more HTF to transfer more heat to the process tool when the temperature indicated by temperature sensor 242 is below a target temperature. In another example, controller 210 may cause the pump 223 to pump more HTF to transfer more heat from the process tool when the temperature indicated by temperature sensor 242 is above a target temperature. In a further example, controller 210 may cause the pump 223 to pump less HTF to transfer less heat to the process tool 216 when the temperature indicated by temperature sensor 242 is above a target temperature. In another example, controller 210 may cause the pump 223 to pump more HTF to transfer less heat from the process tool 216 when the temperature indicated by temperature sensor 242 is below a target temperature. In some embodiments, the controller 210 determines a fault in the heat transfer system 200 based on temperature data. In some embodiments, controller 210 may trigger an interlock to shut down system 200 responsive to receiving temperature data indicating the HTF has overheated. The interlock may cut off power to heating unit 228B to stop heating of the HTF. Similarly, the interlock may cut off power to process tool 216 to stop a heat generating process occurring in process tool 216. In some embodiments, the pump 223 is caused to increase flowrate of HTF during the duration of an overheating condition.

In some embodiments, a pressure sensor 244 measures the pressure of the HTF. In some embodiments, pressure sensor 244 measures the pressure of HTF flowing from the process tool 216. In some embodiments, a pressure sensor measures the pressure of HTF flowing into the process tool 216. The controller 210 may monitor the pressure data to determine whether there is a leak in the system. For example, pressure data indicating a fluctuation or a sudden drop in HTF pressure may correspond to a sudden leak in the closed loop or the reservoir 227. Upon receiving pressure data indicating a fluctuation or sudden drop in HTF pressure, controller 210 may trigger an interlock to stop the flow of HTF. In some embodiments, the interlock may include cutting off power to pump 223 to stop the pumping of HTF.

In some embodiments, flowing HTF from the TCU 229 to the process tool 216 regulates the temperature of process tool 216. In some embodiments, controller 210 causes HTF to be warmed or cooled inside TCU 229 to a target temperature. The target temperature of the HTF may correspond to a target temperature of a process performed in process tool 216. In some embodiments, controller 210 causes regulation of the HTF temperature to the target temperature by activating cooling unit 228A and/or heating unit 228B as discussed above. In some embodiments, heat transfer system 200 includes redundant sensors for determining whether there is an HTF leak. In some embodiments, controller 210 determines whether an HTF leak exists based on two more types of sensor data (e.g., two or more of pressure sensor data, temperature sensor data, flow sensor data, tank level sensor data, etc.).

Figure 3:
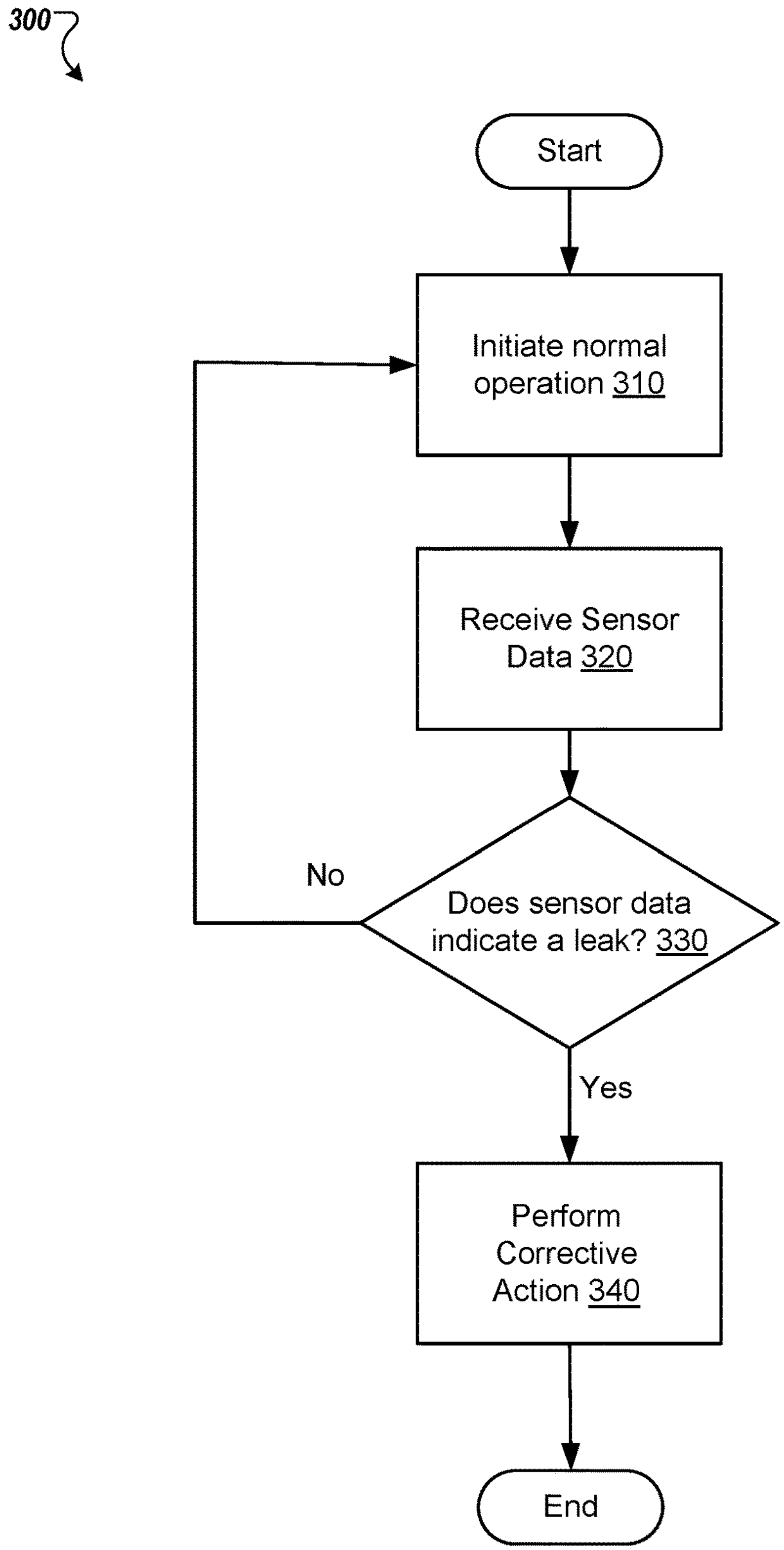
FIG. 3 is an example flow diagram for controlling an example heat transfer system, according to aspects of the present disclosure.

FIG. 3 is an example flow diagram 300 for controlling an example heat transfer system, according to aspects of the present disclosure. In some embodiments, flow diagram 300 is for controlling a heat transfer system such as system 200 illustrated in FIG. 2. In some embodiments, the method shown in flow diagram 300 may be carried out by a controller such as controller 210.

At operation 310, in some embodiments, normal operation of a heat transfer system is initiated. In some embodiments, normal operation includes flowing an HTF (e.g., a flammable HTF) along a flow path of a closed loop to transfer heat to or from a process tool. In some embodiments, a pump is activated to pump HTF between a TCU and the process tool. In some embodiments, flowing the HTF to the process tool regulates temperature of the process tool. In some embodiments, temperature of the HTF is regulated in the TCU by cooling and/or heating the HTF by a cooling unit and/or by a heating unit. In some embodiments, the TCU includes a reservoir to collect the HTF and the pump.

At operation 320, a controller receives sensor data from one or more sensors. The one or more sensors may include one or more flow sensors, one or more temperature sensors, a tank level sensor, and/or one or more pressure sensors. In some embodiments, the sensors measure one or more properties of the HTF.

At operation 330, the controller determines whether the sensor data indicates a leak in the closed loop and/or a leak in the reservoir of the TCU. In some embodiments, the controller compares flowrate data (e.g., measured by flow sensors) to determine if a leak in the closed loop exists. A mismatch in first flowrate data from a first flow sensor and second flowrate data from a second flow sensor may indicate to the controller that the closed loop is leaking HTF. Leaking HTF may pose a fire hazard. In some embodiments, the controller monitors pressure data to determine if a leak exists. A sudden fluctuation or decrease in pressure may indicate to the controller that there is an HTF leak. In some embodiments, the controller monitors level data from a tank level sensor. The tank level sensor may measure the level of HTF in the reservoir of the TCU. The level of the HTF in the reservoir suddenly falling or falling below a threshold level may indicate to the controller that there is an HTF leak. Responsive to determining that there is no leak, the flow proceeds to operation 310 and operation of the system continues as normal. Responsive to determining that there is a leak, the flow proceeds to operation 340.

At operation 340, a corrective action is performed. The corrective action may be triggering an interlock, and/or initiating a fault alarm. In some embodiments, there are multiple levels of fault alarms depending on the criticality of the leak. One level of fault alarm may be a warning alarm and another higher level of fault alarm may be an emergency alarm. In some embodiments, operation of the system is ceased. In some embodiments, responsive to determining that there is an HTF leak, the controller causes a corrective action such as triggering an interlock to stop the flow of HTF in the closed loop. In some embodiments, the interlock cuts off power to the pump so the pump stops pumping HTF. Stopping the flow of HTF may mitigate a possible leak and may prevent more HTF from leaking.

Figure 4:
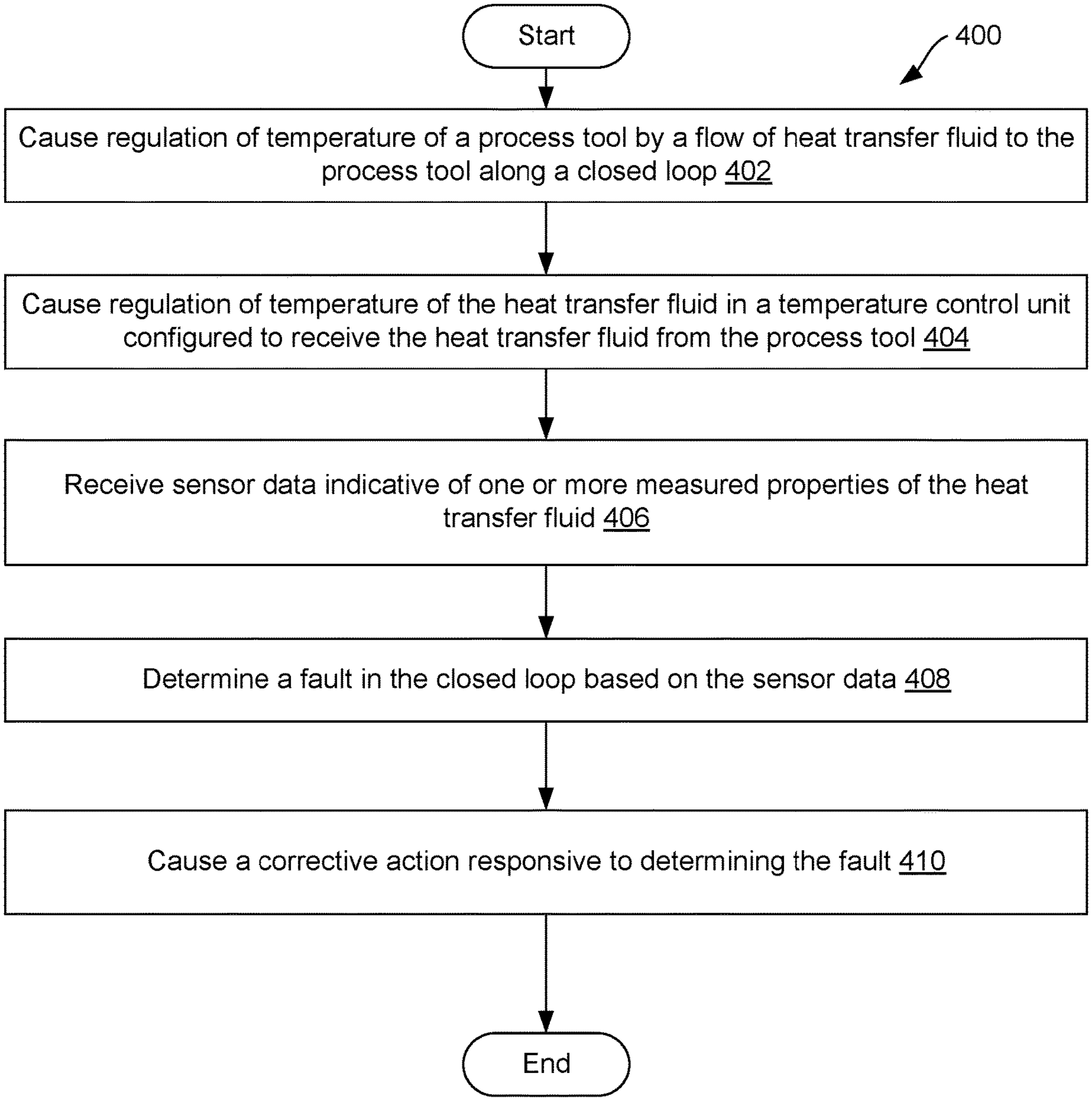
FIG. 4 is an example flow diagram of a method for controlling a heat transfer system, according to aspects of the present disclosure.

FIG. 4 is an example flow diagram of a method 400 for controlling a heat transfer system, according to aspects of the present disclosure. Method 400 is performed by processing logic that can include hardware (circuitry, dedicated logic, etc.), software (such as is run on a general purpose computer system or a dedicated machine), firmware, or some combination thereof. In one implementation, method 400 can be performed by a computer system. In some aspects, one or more operations of method 400 can be performed by controller 210 of FIG. 2.

For simplicity of explanation, method 400 is depicted and described as a series of operations. However, operations in accordance with this disclosure can occur in various orders and/or concurrently and with other operations not presented and described herein. Furthermore, not all illustrated operations may be performed to implement method 400 in accordance with the disclosed subject matter. In addition, those skilled in the art will understand and appreciate that method 400 could alternatively be represented as a series of interrelated states via a state diagram or events.

In some embodiments, at block 402, processing logic (e.g., of a controller) causes regulation of temperature of a process tool by a flow of heat transfer fluid to the process tool along a closed loop. In some embodiments, the heat transfer fluid is flowed to the process tool to regulate the temperature of the process tool to a target temperature. In some embodiments, heat transfer fluid is circulated along a flow path of the closed loop. In some embodiments, the closed loop is sealed (e.g., using substantially leak-proof connectors, welded joints, sealed tanks, etc.) so that the heat transfer fluid does not contact outside air. In some embodiments, the heat transfer fluid is flowed (e.g., along the closed loop) between a temperature control unit and the process tool. In some embodiments, the process tool is a substrate processing chamber such as a deposition chamber, an etch chamber, a plasma process chamber, etc. In some embodiments, the heat transfer fluid is a flammable and/or combustible liquid.

In some embodiments, at block 404, processing logic causes regulation of temperature of the heat transfer fluid in a temperature control unit. In some embodiments, the temperature control unit includes a reservoir configured to receive the heat transfer fluid from the process tool. In some embodiments, processing logic controls a heating unit and/or a cooling unit in the reservoir to heat or cool the heat transfer fluid received from the process tool. In some embodiments, a heating unit includes one or more resistive heating elements to heat the heat transfer fluid in the reservoir. In some embodiments, a cooling unit includes a heat exchanger to cool the heat transfer fluid in the reservoir.

In some embodiments, at block 406, processing logic receives sensor data indicative of one or more measured properties of the heat transfer fluid. In some embodiments, processing logic receives temperature data from one or more temperature sensors, pressure data from one or more pressure sensors, flowrate data from one or more flow sensors, and/or level data from one or more tank level sensors (e.g., disposed within the reservoir).

In some embodiments, at block 408, processing logic determines a fault in the closed loop and/or the temperature control unit based on the sensor data. In some embodiments, the fault includes a fluid leak in the closed loop or an overheating condition of the heat transfer fluid. In some embodiments, processing logic determine the fault by comparing first flowrate data from a first flow sensor with second flowrate data from a second flow sensor. In some embodiments, a mismatch in flowrate data indicates a leak in the closed loop. In some embodiments, processing logic determines the fault based on the level of heat transfer fluid in the reservoir of the temperature control unit as measured by a tank level sensor (e.g., a float sensor in the reservoir, etc.).

In some embodiments, when the level falls below a threshold range, processing logic determines that a leak exists. In some embodiments, processing logic determines the fault based on pressure sensor data. In some embodiments, a fluctuation in heat transfer fluid pressure beyond a threshold range of pressure values indicates that a leak exists. In some embodiments, a sudden drop in heat transfer fluid pressure below a threshold value indicates a leak exists. In some embodiments, processing logic determines the fault based on temperature sensor data. In some embodiments, the temperature of the heat transfer fluid exceeding a threshold temperature value indicates an overheating condition exists. In some embodiments, the threshold temperature corresponds to a flashpoint of the heat transfer fluid and/or a flammability limit. The flash point may be the lowest temperature at which the heat transfer fluid can give off a vapor to form an ignitable mixture in air.

In some embodiments, at block 410, processing logic causes a corrective action responsive to determining the fault (e.g., at block 408). In some embodiments, the corrective action includes triggering an interlock to stop the flow of heat transfer fluid in the closed loop. In some embodiments, the flow of heat transfer fluid is stopped to minimize the amount of heat transfer fluid leaked. In some embodiments, the corrective action includes shutting down the process tool. Shutting down the process tool may stop a heat generating process inside the process tool to mitigate overheating of the heat transfer fluid.

Figure 5:
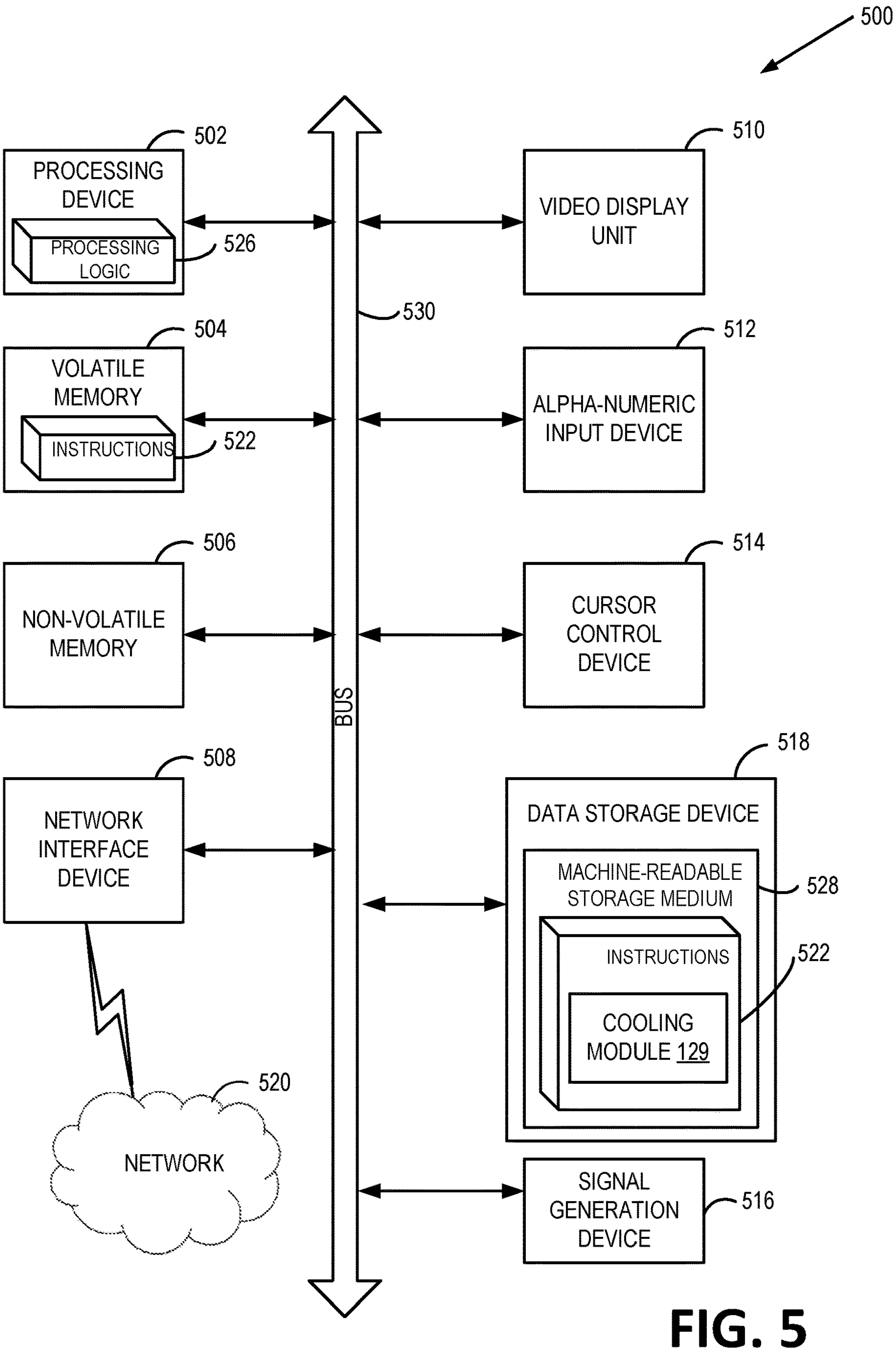
FIG. 5 depicts a block diagram of an example computing device, operating in accordance with one or more aspects of the present disclosure.

FIG. 5 depicts a block diagram of an example computing device, operating in accordance with one or more aspects of the present disclosure. In various illustrative examples, various components of the computing device 500 may represent various components of the system controller 128, controller 210, and so on.

Example computing device 500 may be connected to other computer devices in a LAN, an intranet, an extranet, and/or the Internet (e.g., using a cloud environment, cloud technology, and/or edge computing). Computing device 500 may operate in the capacity of a server in a client-server network environment. Computing device 500 may be a personal computer (PC), a set-top box (STB), a server, a network router, switch or bridge, or any device capable of executing a set of instructions (sequential or otherwise) that specify actions to be taken by that device. Further, while only a single example computing device is illustrated, the term "computer" shall also be taken to include any collection of computers that individually or jointly execute a set (or multiple sets) of instructions to perform any one or more of the methods discussed herein.

Example computing device 500 may include a processing device 502 (also referred to as a processor or CPU), a main memory 504 (e.g., read-only memory (ROM), flash memory, dynamic random access memory (DRAM) such as synchronous DRAM (SDRAM), etc.), a static memory 506 (e.g., flash memory, static random access memory (SRAM), etc.), and a secondary memory (e.g., a data storage device 518), which may communicate with each other via a bus 530.

Processing device 502 represents one or more general-purpose processing devices such as a microprocessor, central processing unit, or the like. More particularly, processing device 502 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processing device 502 may also be one or more special-purpose processing devices such as an application specific integrated circuit (ASIC), a field programmable gate array (FPGA), a digital signal processor (DSP), network processor, or the like. In accordance with one or more aspects of the present disclosure, processing device 502 may be configured to execute instructions implementing method 400 illustrated in FIG. 4.

Example computing device 500 may further comprise a network interface device 508, which may be communicatively coupled to a network 520. Example computing device 500 may further comprise a video display 510 (e.g., a liquid crystal display (LCD), a touch screen, or a cathode ray tube (CRT)), an alphanumeric input device 512 (e.g., a keyboard), a cursor control device 514 (e.g., a mouse), and an acoustic signal generation device 516 (e.g., a speaker).

Data storage device 518 may include a machine-readable storage medium (or, more specifically, a non-transitory machine-readable storage medium) 528 on which is stored one or more sets of executable instructions 522. For example the data storage may be physical storage on-premise or remote such as a cloud storage environment. In accordance with one or more aspects of the present disclosure, executable instructions 522 may comprise executable instructions associated with executing method 400 of FIG. 7. In one embodiment, instructions 522 include instructions for cooling module 129 of FIG. 1.

Executable instructions 522 may also reside, completely or at least partially, within main memory 504 and/or within processing device 502 during execution thereof by example computing device 500, main memory 504 and processing device 502 also constituting computer-readable storage media. Executable instructions 522 may further be transmitted or received over a network via network interface device 508.

While the computer-readable storage medium 528 is shown in FIG. 5 as a single medium, the term "computer-readable storage medium" should be taken to include a single medium or multiple media (e.g., a centralized or distributed database, and/or associated caches and servers) that store the one or more sets of operating instructions. The term "computer-readable storage medium" shall also be taken to include any medium that is capable of storing or encoding a set of instructions for execution by the machine that cause the machine to perform any one or more of the methods described herein. The term "computer-readable storage medium" shall accordingly be taken to include, but not be limited to, solid-state memories, and optical and magnetic media.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, as apparent from the following discussion, it is appreciated that throughout the description, discussions utilizing terms such as "providing," "determining," "storing," "adjusting," "causing," "receiving," "comparing," "creating," "stopping," "loading," "copying," "throwing," "replacing," "performing," "inputting," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Examples of the present disclosure also relate to an apparatus for performing the methods described herein. This apparatus may be specially constructed for the purposes, or it may be a general purpose computer system selectively programmed by a computer program stored in the computer system. Such a computer program may be stored in a computer readable storage medium, such as, but not limited to, any type of disk including optical disks, compact disc read only memory (CD-ROMs), and magnetic-optical disks, read-only memories (ROMs), random access memories (RAMs), erasable programmable read-only memory (EPROMs), electrically erasable programmable read-only memory (EEPROMs), magnetic disk storage media, optical storage media, flash memory devices, other type of machine-accessible storage media, or any type of media suitable for storing electronic instructions, each coupled to a computer system bus.

The methods and displays presented herein are not inherently related to any particular computer or other apparatus. Various general purpose systems may be used with programs in accordance with the teachings herein, or it may prove convenient to construct a more specialized apparatus to perform the method operations. The structure for a variety of these systems will appear as set forth in the description below. In addition, the scope of the present disclosure is not limited to any particular programming language. It will be appreciated that a variety of programming languages may be used to implement the teachings of the present disclosure.

It is to be understood that the above description is intended to be illustrative, and not restrictive. Many other implementation examples will be apparent to those of skill in the art upon reading and understanding the above description. Although the present disclosure describes specific examples, it will be recognized that the systems and methods of the present disclosure are not limited to the examples described herein, but may be practiced with modifications within the scope of the appended claims. Accordingly, the specification and drawings are to be regarded in an illustrative sense rather than a restrictive sense. The scope of the present disclosure should, therefore, be determined with reference to the appended claims, along with the full scope of equivalents to which such claims are entitled.

What is claimed is:

1. A system comprising:

a closed loop configured to flow a heat transfer fluid to regulate temperature of a process tool, wherein the heat transfer fluid comprises a flammable or combustible fluid;

a temperature control unit configured to receive the heat transfer fluid and regulate temperature of the heat transfer fluid;

a plurality of sensors configured to measure one or more properties of the heat transfer fluid, wherein one or more first sensors are configured to measure the one or more properties of the heat transfer fluid flowing along a first flow path from the temperature control unit to the process tool, and wherein one or more second sensors are configured to measure the one or more properties of the heat transfer fluid flowing along a second flow path from the process tool to the temperature control unit; and a controller configured to determine a fault in the closed loop based on a mismatch between first sensor data received from the one or more first sensors and second sensor data received from the one or more second sensors, the controller to further cause a corrective action responsive to determining the fault.

2. The system of claim 1, wherein the plurality of sensors comprises one or more of:

one or more temperature sensors, one or more flow sensors, one or more gas detection sensors, a tank level sensor, or one or more pressure sensors.

3. The system of claim 2, wherein the first sensor data comprises first flowrate data, and wherein the second sensor data comprises second flowrate data.

4. The system of claim 1, wherein the temperature control unit comprises:

a sealed tank along a flow path of the closed loop and configured to receive the heat transfer fluid; and a pump configured to pump the heat transfer fluid along the flow path of the closed loop.

5. The system of claim 1, wherein the temperature control unit comprises one or more of a heating unit configured to heat the heat transfer fluid for heating the process tool or a cooling unit configured to cool the heat transfer fluid for cooling the process tool.

6. The system of claim 5, wherein the heating unit comprises one or more resistive heating elements.

7. The system of claim 1, wherein the fault in the closed loop comprises one or more of a heat transfer fluid leak in the closed loop or an overheating condition of the heat transfer fluid.

8. The system of claim 1, wherein the corrective action comprises triggering an interlock to stop the flow of the heat transfer fluid in the closed loop.

9. The system of claim 1, further comprising the process tool, wherein the process tool comprises a substrate processing chamber.

10. A method comprising:

causing regulation of temperature of a process tool by a flow of heat transfer fluid to the process tool along a closed loop, wherein the heat transfer fluid comprises a flammable or combustible fluid;

causing regulation of temperature the heat transfer fluid in a temperature control unit configured to receive the heat transfer fluid from the process tool;

receiving first sensor data indicative of one or more measured properties of the heat transfer fluid flowing along a first flow path from the temperature control unit to the process tool;

receiving second sensor data indicative of the one or more measured properties of the heat transfer fluid flowing along a second flow path from the process tool to the temperature control unit;

determining a fault in the closed loop based on a mismatch between the first sensor data and the second sensor data; and causing a corrective action responsive to determining the fault.

11. The method of claim 10, wherein the sensor data is received from a plurality of sensors comprising one or more of:

one or more temperature sensors, one or more flow sensors, a tank level sensor, or one or more pressure sensors.

12. The method of claim 11, wherein the first sensor data comprises first flowrate data, and wherein the second sensor data comprises second flowrate data.

13. The method of claim 10, wherein causing regulation of the heat transfer fluid in the temperature control unit comprises activating a heating unit configured to heat the heat transfer fluid for heating the process tool.

14. The method of claim 10, wherein the fault in the closed loop comprises one or more of a heat transfer fluid leak in the closed loop or an overheating condition of the heat transfer fluid.

15. The method of claim 10, wherein the corrective action comprises triggering an interlock to stop the flow of the heat transfer fluid in the closed loop.

16. The method of claim 10, wherein the process tool comprises a substrate processing chamber.

17. A system comprising:

a temperature control unit;

a process tool;

a closed loop to flow a heat transfer fluid between the temperature control unit and the process tool, wherein the heat transfer fluid comprises a flammable or combustible fluid;

a plurality of sensors configured to measure one or more properties of the heat transfer fluid, wherein one or more first sensors are configured to measure the one or more properties of the heat transfer fluid flowing along a first flow path from the temperature control unit to the process tool, and wherein one or more second sensors are configured to measure the one or more properties of the heat transfer fluid flowing along a second flow path from the process tool to the temperature control unit; and a controller, wherein the controller is configured to:

cause the heat transfer fluid to flow along the closed loop to regulate temperature of the process tool;

cause the temperature control unit to regulate temperature of the heat transfer fluid;

receive first sensor data from the one or more first sensors indicative of the one or more properties of the heat transfer fluid flowing along the first flow path;

receive second sensor data from the one or more second sensors indicative of the one or more properties of the heat transfer fluid flowing along the second flow path;

determine a fault in the closed loop based on a mismatch between the first sensor data and the second sensor data; and cause a corrective action responsive to determining the fault.

18. The system of claim 17, wherein the plurality of sensors comprises one or more of:

one or more temperature sensors, one or more flow sensors, a tank level sensor, or one or more pressure sensors.

19. The system of claim 17, wherein the temperature control unit comprises a sealed tank configured to receive the heat transfer fluid from the closed loop.

20. The system of claim 17, wherein the fault in the closed loop comprises one or more of a heat transfer fluid leak in the closed loop, and wherein the corrective action comprises triggering an interlock to stop the flow of the heat transfer fluid in the closed loop.

* * * * *